United States Patent [19]

Takeuchi

[11] Patent Number: 5,501,388
[45] Date of Patent: Mar. 26, 1996

[54] WIRE BONDING APPARATUS

[75] Inventor: Takashi Takeuchi, Higashiyamato, Japan

[73] Assignee: Kabushiki Kaisha Shinkawa, Tokyo, Japan

[21] Appl. No.: 343,256

[22] Filed: Nov. 19, 1994

[30] Foreign Application Priority Data

Nov. 25, 1993 [JP] Japan ............... 5-319049

[51] Int. Cl.⁶ ............... H01L 21/607
[52] U.S. Cl. ............... 228/1.1; 228/105
[58] Field of Search ............... 228/1.1, 4.5, 8, 228/105, 110.1, 179.5; 156/73.2, 580.1

[56] References Cited

U.S. PATENT DOCUMENTS 4,877,173  10/1989  Fujimoto et al. ............... 228/1.1

FOREIGN PATENT DOCUMENTS 4-320350  11/1992  Japan ............... H01L 21/60
4-317342  11/1992  Japan ............... H01L 21/60
5-39632  10/1993  Japan ............... H01L 21/607

*Primary Examiner*—Samuel M. Heinrich
*Attorney, Agent, or Firm*—Koda and Androlia

[57] ABSTRACT

A bonding apparatus used in manufacturing, for example semiconductor devices, including an adiabatic plate provided beneath a bonding horn for blocking the radiant heat from a heating block that heats up a workpiece. The apparatus further includes horn cooling pipes and a mirror tube cooling pipe for blowing cooling air onto a bonding horn and onto a mirror tube of a detection camera or a detection camera supporting arm.

4 Claims, 1 Drawing Sheet

WIRE BONDING APPARATUS

BACKGROUND OF THE INVENTION

1. Field of the Invention

The present invention relates to a wire bonding apparatus.

2. Prior Art

One type of wire bonding apparatus includes a heating block, which is used to heat a workpiece, and a bonding horn which is positioned above this heating block so as to hold the capillary. Thus, the bonding horn is caused to undergo thermal expansion by the radiant heat from the heating block, and this results in a drop of the precision of the bonding position.

The structure disclosed, for example, in the Japanese Utility Model Application Publication (Kokoku) No. 5-396732 has been proposed as a means to prevent thermal expansion of the bonding horn. In this structure, a heat-shielding plate which is semicircular in cross section is installed so that the plate covers the circumferential surface of the lower part of the bonding horn. In addition, it is designed so that cooling air is blown between the bonding horn and the heat-shielding plate.

Further to the heating block, a wire bonding apparatus is generally equipped with: (a) an X-axis motor and Y-axis motor which drive an XY table and a bonding head in the X and Y directions, (b) a bonding horn which holds the capillary, (c) a Z-axis motor which causes the lifter arm to which the bonding horn is attached to pivot or move vertically, and (d) a bonding-load linear motor which applies a bonding load to the capillary so that the capillary presses the ball or wire against the bonding point.

The wire bonding apparatus of this type is disclosed, for example, in the Japanese Patent Application Laid-Open (Kokai) Nos. 4-317342 and 4-320350.

A wire bonding apparatus further includes a detection camera which detects the workpiece. Two types of cameras are known presently. In one type, a mirror tube which has a workpiece detection part is installed horizontally in an offset position with respect to the capillary, the detection camera is attached to the mirror tube, and the mirror tube is fastened to the bonding head. In another type, the detection camera is fastened to a camera supporting arm so as to be at an offset position with respect to a capillary, and the camera supporting arm is fastened to the bonding head. With the thus installed cameras, the bonding point is first detected by the detection camera, then the bonding coordinates are corrected, and then the capillary is driven in the X and Y directions and also in the Z direction. Wire bonding is performed after these movements.

In the prior art described above, countermeasures are taken only against the thermal expansion of the bonding horn that is caused by the radiant heat of the heating block. In other words, no consideration is given to the fact that the mirror tube and the camera supporting arm are also caused to thermally expand. The mirror tube and camera supporting arm are positioned above the heating block; therefore, they can easily undergo thermal expansion as a result of the thermal expansion of the heating block.

When the mirror tube and camera supporting arm thus undergo thermal expansion, the position of the point which is detected as the bonding point tends to shift, resulting in that a positional discrepancy occurs relative to the capillary. When a relative positional discrepancy thus occurs between the detected point and the capillary, the precision of the bonding position drops.

Furthermore, in the prior art described above, no consideration is given to other heat-emitting sources than the heating block. Accordingly, the bonding horn and the mirror tube or camera supporting arm may expand due to thermal expansion caused by heat emitted from the bonding horn, Z-axis motor and bonding-load liner motor, resulting in that positional discrepancies are generated in the capillary and workpiece detection part. In other words, even if thermal expansion of the bonding horn caused by the heating block is prevented in the conventional apparatuses, such is usually insufficient.

Meanwhile, the heat generated by the X-axis motor and Y-axis motor generally have almost no effect on the bonding horn, mirror tube or camera supporting arm.

SUMMARY OF THE INVENTION

Accordingly, the object of the present invention is to provide a wire bonding apparatus in which thermal expansion of the bonding horn and mirror tube or camera supporting arm is prevented so that discrepancies in the bonding position are reduced, thus improving the bonding precision.

The object of the present invention is accomplished by a unique structure for a wire bonding apparatus that includes (i) a bonding horn which holds a capillary at one end, and (ii) a detection camera which detects the workpiece, so that the pads of semiconductor pellets on a workpiece are connected to the leads of lead frames via wires that pass through the capillary, and the unique structure includes:

an adiabatic plate installed beneath the bonding horn so as to block the radiant heat of the heating block which heats the workpiece, and a cooling air supply means which blows cooling air onto the bonding horn and the mirror tube of the camera or the camera supporting arm which supports the camera.

The object of the present invention is further accomplished by a unique structure for a wire bonding apparatus that includes (i) a bonding horn which holds a capillary at one end, and (ii) a detection camera which detects the workpiece, so that the pads of semiconductor pellets on a workpiece are connected to the leads of lead frames via wires which pass through the capillary, and the unique structure includes:

an adiabatic plate installed beneath the bonding horn so as to block the radiant heat of the heating block which heats the workpiece, a cooling air supply means which blows cooling air onto the bonding horn and the mirror tube of the camera or the camera supporting arm which supports the camera, and a cooling air supply means which blows cooling air onto the Z-axis motor and the bonding-load linear motor.

With the structures above, the heat radiated from the heating block onto the bonding arm is blocked by the adiabatic plate. The heat emitted by the bonding horn and by the mirror tube or camera supporting arm is controlled by the cooling air blown out by the cooling air supply means. As a result, the bonding horn and the mirror tube and camera supporting arm show little expansion that is caused by thermal expansion. Accordingly, there is little shift in the bonding position, and the precision of the bonding position is improved.

Furthermore, the Z-axis motor and the bonding-load linear motor are also cooled by cooling air supplied by the cooling air supply means. Accordingly, the precision of the bonding position is improved even further.

DETAILED DESCRIPTION OF THE INVENTION

Figure 1:
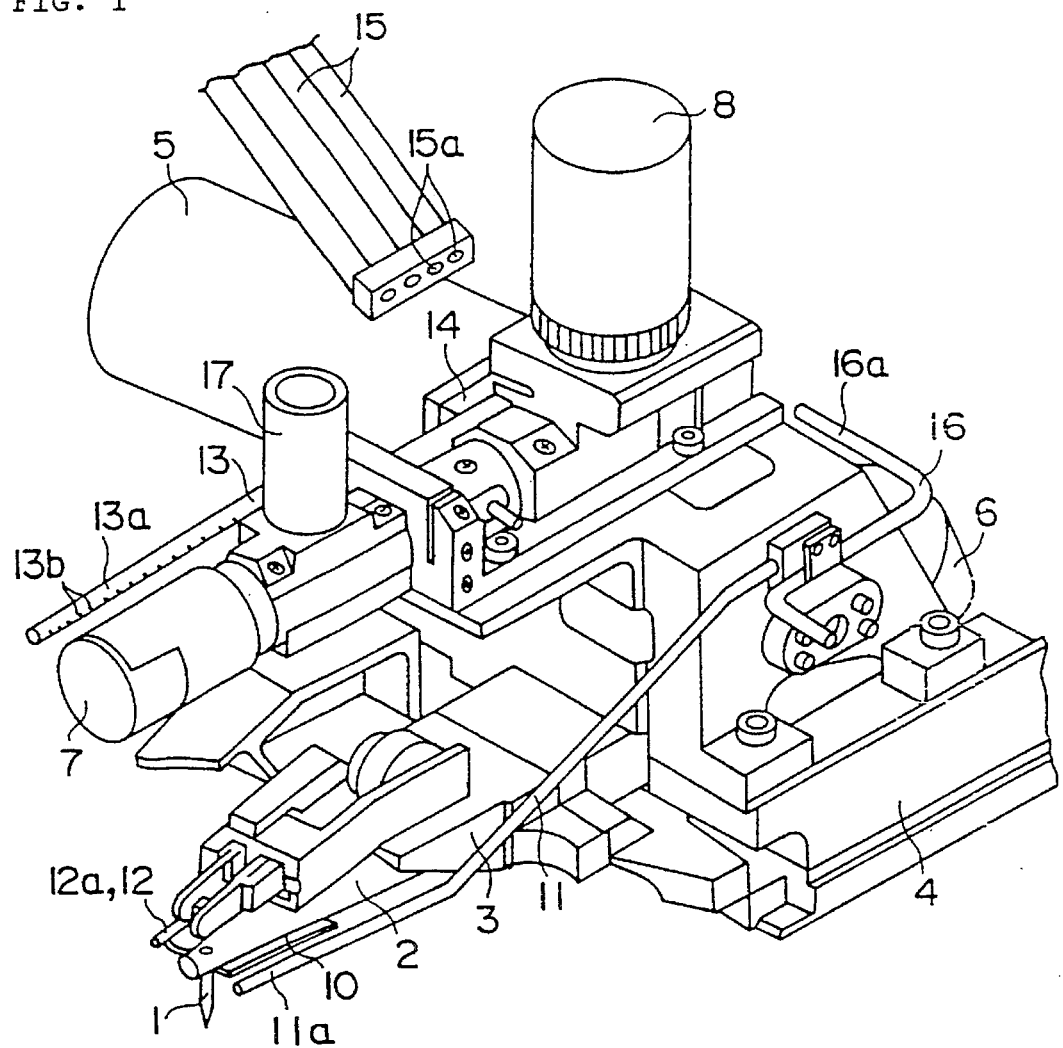
FIG. 1 is a perspective view of one embodiment of the wire bonding apparatus of the present invention.

One embodiment of the present invention will be described below with reference to FIG. 1.

A bonding arm 2 for holding a capillary 1 at one end is attached to a lifter arm 3. The lifter arm 3 is provided on a bonding head 4 so that the lifter arm can pivot or move vertically. The pivot or vertical movement of the lifter arm 3 is effected by a Z-axis motor 5 which is installed on the bonding head 4.

The coil side of a bonding-load linear motor 6 which applies a bonding load for causing the capillary 1 to press the ball or wire against the bonding point is fastened to the lifter arm 3, and the magnet side of the bonding-load linear motor 6 is fastened to the bottom part of the bonding head 4 or to the upper surface of an XY table (not shown).

A mirror tube 7 which is used to detect a workpiece is installed horizontally and fastened to the bonding head 4. The detection part which detects the workpiece is provided on the undersurface of one end of the mirror tube 7, and a detection camera 8 which is provided on the bonding head 4 is connected to the other end of the mirror tube 7. The bonding head 4 is fastened to the surface of the XY table (not shown).

The structure described above is well known, and therefore, a further description will be omitted.

A radiant heat shielding plate 10 is installed beneath the bonding horn 2. The shielding plate 10 is positioned so as not to interfere with the bonding horn 2 even when the bonding horn 2 is moved downward. The radiant heat shielding plate 10 is fastened to the front surface of the bonding head 4.

A pair of horn cooling pipes 11 and 12 are installed on both sides of the bonding horn 2. The pipes 11 and 12 respectively have air blowing section 11a and 12a that run along the bonding horn 2. Numerous air blowing holes (not shown) which blow air toward the bonding horn 2 are formed in the air blowing section 11a and 12a of the horn cooling pipes 11 and 12.

In addition, a mirror tube cooling pipe 13 is installed on one side of the mirror tube 7. The cooling pipe 13 has an air blowing section 13a that runs along the mirror tube 7. The mirror tube cooling pipe 13 is fastened to the side surface of the bonding head 4. Numerous air blowing holes 13b which blow air to the mirror-tube 7 are formed in the air blowing part 13a of the cooling pipe 13.

The Z-axis motor 5 is installed on the bonding head 4 with an adiabatic plate 14 in between. A plurality of Z-axis motor cooling pipes 15 are installed above the Z-axis motor 5. The cooling pipes 15 have air blowing holes 15a which face the heat-generating section of the Z-axis motor 5. The Z-axis motor cooling pipes 15 are provided on a fixed part of the apparatus (not shown).

A linear motor cooling pipe 16 which has an air blowing part 16a is installed above the bonding-load linear motor 6. The linear motor cooling pipe 16 is fastened to the side surface of the bonding head 4. Numerous air blowing holes (not shown) which blow air toward the bonding-load linear motor 6 are formed in the air blowing part 16a.

In the Figure, the reference numeral 17 is an illuminating tube; and pipes (not shown) which supply cooling air from cooling air sources (not shown) are connected to the horn cooling pipes 11 and 12, mirror tube cooling pipe 13, Z-axis motor cooling pipes 15 and linear motor cooling pipe 16.

Next, the operation of the above described embodiment will be described.

During the wire bonding operation, cooling air is blown out from the horn cooling pipes 11 and 12, mirror tube cooling pipe 13, Z-axis motor cooling pipes 15 and linear motor cooling pipe 16. The heat generated from the bonding horn 2 is controlled (or cooled) by the cooling air blown out from the horn cooling pipes 11 and 12, the heat emitted by the mirror tube 7 is controlled by the cooling air blown out from the mirror tube cooling pipe 13, the heat emitted by the Z-axis motor 5 is controlled by the cooling air blown out from the Z-axis motor cooling pipes 15, and the heat emitted by the bonding-load linear motor 6 is controlled by the cooling air blown out from the linear motor cooling pipe 16.

In addition, the transmission of radiant heat from the heating block (not shown) to the bonding horn 2 is blocked by the radiant heat shielding plate 10. In addition, the transmission of heat emitted by the Z-axis motor 5 to the bonding head 4 is controlled by the adiabatic plate 14.

As seen from the above, the bonding horn 2 and mirror tube 7 undergo little thermal expansion because of the cooling air blown thereto, and therefore, they show little expansion or elongation. As a result, no bonding position shifts occur, and the precision of the bonding position is improved.

The inventor conducted several tests, and the test results indicate that the factors having the greatest affect onto the expansion of the bonding horn 2 and the mirror tube 7 are the radiant heat from the heating block and the heat generated by the ultrasonic oscillation of the bonding horn 2. Thus, as seen from the above, with the radiant heat shielding plate 10, horn cooling pipes 11 and 12 and mirror tube cooling pipe 13, an extremely great cooling (or non-expansion) effect was obtained. An even more superior effect was obtained in the tests when the Z-axis motor cooling pipes 15 and linear motor cooling pipe 16 were installed.

In the above embodiment, the mirror tube 7 is installed on the bonding head 4. However, it goes without saying that the present invention is applicable to apparatuses of the type in which the detection camera 8 is provided on the bonding head 4 via a camera supporting arm. In such a case, the mirror tube cooling pipe 13 is a camera supporting arm cooling pipe, and the camera supporting arm is cooled.

As seen from the above, according to the present invention, an adiabatic plate which blocks the radiant heat from the heating block that heats the workpiece is installed beneath the bonding horn, and cooling air supply means are also provided so as to blow cooling air onto the bonding horn and onto the mirror tube of the detection camera or a camera supporting arm which supports the detection camera. Accordingly, these element can stay not-heated, and discrepancies in the bonding position which are generally caused by heat is reduced, and the bonding precision is improved.

I claim:

1. A wire bonding apparatus comprising a bonding horn which holds a capillary at one end and a detection camera which detects a workpiece so that pads of semiconductor pellets on a workpiece are connected to leads of lead frames via wires which pass through said capillary; and said apparatus further comprising:

an adiabatic plate installed beneath said bonding horn so as to block radiant heat of said heating block which heats said workpiece, and a cooling air supply means which blows cooling air to said bonding horn and to a mirror tube of said detection camera or a camera supporting arm which supports said detection camera.

2. A wire bonding apparatus according to claim 1, further comprising a cooling air supply means which blows cooling air onto a Z-axis motor and a bonding-load linear motor which are provided in said bonding apparatus.

3. A wire bonding apparatus comprising a bonding horn which holds a capillary at one end, a detection camera which detects a workpiece upon which bonding is to be executed, and a heating block for heating said workpiece; and said apparatus further comprising an adiabatic plate installed beneath said bonding horn so as to block radiant heat of said heating block.

4. A wire bonding apparatus according to claim 3, -further comprising a cooling air supply means which blows cooling air to at least one of a mirror tube of said detection camera, a camera supporting arm which supports said detection camera, a Z-axis motor, a bonding-load linear motor and said bonding horn which are provided in said bonding apparatus.

* * * * *